United States Patent [19]

Luich et al.

[11] Patent Number: 4,973,862
[45] Date of Patent: Nov. 27, 1990

[54] HIGH SPEED SENSE AMPLIFIER

[75] Inventors: Thomas M. Luich, Campbell, Calif.;
Huard, Jeffry M., Puyallup, Wash.

[73] Assignee: National Semiconductor Corporation, Santa Clara, Calif.

[21] Appl. No.: 320,317

[22] Filed: Mar. 7, 1989

[51] Int. Cl.[5] ............................................. H03K 19/00
[52] U.S. Cl. ................................. 307/473; 307/456; 307/530
[58] Field of Search ............... 307/536, 456, 466, 350, 307/473

[56]  References Cited

U.S. PATENT DOCUMENTS

| | | | |
|---|---|---|---|
| 4,049,975 | 9/1977 | Colaco | 307/213 |
| 4,199,731 | 4/1980 | Taylor et al. | 307/446 |
| 4,311,927 | 1/1982 | Ferris | 307/473 |
| 4,321,490 | 3/1982 | Bechdolt | 307/456 |
| 4,339,676 | 7/1982 | Ramsey | 307/473 |
| 4,445,052 | 4/1984 | Higashi | 307/456 |
| 4,449,063 | 5/1984 | Ohmichi et al. | 307/456 |
| 4,454,432 | 6/1984 | Wood | 307/456 |
| 4,517,475 | 5/1985 | Petty | 307/272 |
| 4,591,741 | 5/1986 | Cooper | 307/456 |
| 4,605,864 | 8/1986 | Varadarajan et al. | 307/270 |
| 4,703,202 | 10/1987 | Enomoto et al. | 307/443 |
| 4,745,308 | 5/1988 | Neely | 307/443 |
| 4,814,645 | 3/1989 | Kitora et al. | 307/456 |
| 4,841,176 | 6/1989 | Millhollan et al. | 307/475 |
| 4,896,058 | 1/1990 | Murray | 307/456 |

FOREIGN PATENT DOCUMENTS

| | | | |
|---|---|---|---|
| 3726005 | 2/1988 | Fed. Rep. of Germany | 307/446 |
| 0188138 | 11/1982 | Japan | 307/456 |
| 0215132 | 12/1983 | Japan | 307/456 |
| 0220525 | 12/1983 | Japan | 307/456 |
| 0010315 | 1/1986 | Japan | 307/456 |
| 0293022 | 12/1986 | Japan | 307/456 |

OTHER PUBLICATIONS

Mrazek, Tri-State Logic in High-Speed Memories of Microprogrammed Computers, 7-71.

*Primary Examiner*—Stanley D. Miller
*Assistant Examiner*—T. Cunningham
*Attorney, Agent, or Firm*—Steven F. Caserza; Lee Patch

[57]  ABSTRACT

A novel sense amplifier is taught which minimizes power consumption by causing selected current sources to conduct current only when an input signal of a selected state is present. The speed of the circuit is fast because capacitance on the critical nodes is minimized by connection of fewer transistors to the critical nodes, as compared with the prior art.

6 Claims, 4 Drawing Sheets

HIGH SPEED SENSE AMPLIFIER

BACKGROUND

This invention pertains to electronic circuits, and more particularly to a sehse amplifer for sensing low level signals and providing higher level output signals. The teachings of this invention is particularly useful in sense amplifiers for use with progammable logic devices.

DESCRIPTION OF THE PRIOR ART

FIG. 1 is a schematic diagram of a typical prior art sense amplifier. The operation of the prior art circuit 100 of FIG. 1 is now described with reference to Table 1.

Sense amplifier 100 includes two input terminals, data input terminal 126 which receives data to be sensed, and enable input terminal 105 which receives a signal defining when the output of sense amplifier 100 is to be enabled. Sense amplifer 100 includes output terminal 135 which provides an output signal which is related to the data signal received on data input terminal 126 when output terminal 135 is enabled, and which is a high impedance output signal when output terminal 135 is disabled. As shown in FIG. 1, sense amplifier 100 includes enable input stage 101a, enable sense amplifier stage 102, data input stage 101b, data sense amplifier stage 103, and output stage 104. Transistor 119 has its collector connected to its base, and thus a reference current IREF flows from a positive voltage source through resistor 117, diode 118, and transistor 119 to ground. This establishes a bias voltage on the base of transistor 121 such that transistor 121 tends to mirror the collector current flowing through transistor 119.

With a logical zero data input signal applied to data input terminal 126, transistor 124 is turned off, and thus does not supply current through diode 123 to the collector of transistor 121. Since transistor 124 supplies no current to the collector of transistor 121, transistor 121 draws its current from transistor 122, which turns on, thus causing node N1 within output stage 104 to be low. With node N1 low, phase splitter transistor 129 is turned off, causing node N2 to be high. This in turn causes output pull-up transistors 131 and 132 to turn on, connecting output terminal 135 to the positive voltage supply, providing a high output signal. Simultaneously, with phase splitter transistor 129 turned off, the emitter of transistor 129 is pulled low by resistor 130, causing output pull down transistor 134 to be turned off.

With a logical one data input signal applied to data input terminal 126, transistor 124 is turned on, and supplies current through diode 123 to the collector of transistor 121. Since transistor 124 supplies current to the collector of transistor 121, transistor 121 does not draw current from transistor 122, which turns off, thus causing node N1 within output stage 104 to be high. With node N1 high, phase splitter transistor 129 is turned on, causing node N2 to be low. This in turn causes output pull-up transistors 131 and 132 to turn off. Simultaneously, with phase splitter transistor 129 turned on, output pull down transistor 134 is turned on, pulling output terminal 135 low.

The above discussion does not consider the effect of enable sense amplifier circuit 102, which operates as follows. Transistor 116 has its base connected to its collector, forming a reference current path from a positive supply voltage, through resistor 114, diode 115, and transistor 116 to ground. This provides a base bias to transistor 110 causing transistor 110 to mirror the collector current flowing through transistor 116. With a logical one enable signal applied to enable input terminal 105, transistor 107 turns on, supplying current to the collector of transistor 110. This places a high voltage on the emitters of transistors 109 and 111, causing transistors 109 and 111 to be turned off. With transistor 109 turned off, node N2 of output stage 104 is high, unless pulled down by phase splitter transistor 129. Similarly, with transistor 111 off, node N1 of output stage 104 is pulled high by resistor 128, unless node N1 is pulled low by transistor 122 of data sense amplifier 103. At this time, output stage 104 is enabled by enable sense amplifier 102, that is enabled to respond by providing an output signal on output signal 135 which is dependent on the state of transistor 122, which in turn is dependent on the state of the data input signal applied to input terminal 126.

Conversely, a logical zero enable signal applied to enable input terminal 105 causes transistor 107 to turn off. Transistor 110 pulls the emitters of transistors 109 and 111 low, causing transistors 109 and 111 to be turned on. With transistor 109 turned on, node N2 of output stage 104 is pulled low, regardless of the state of the phase splitter transistor 129. Similarly, with transistor 111 on, node N1 of output stage 104 is pulled low, regardless of the state of transistor 122 of data sense amplifier 103. At this time, output stage 104 is disabled by enable sense amplifier 102.

While the prior art circuit of FIG. 1 operates to correctly sense the state of the data input signal applied to data input terminal 126, and provides a high impedance signal in response to a high enable signal applied to enable terminal 105, it has several disadvantages. First, it consumes a relatively large amount of power due to the constant current paths which include transistors 116 and 119. In a typical device, transistors 116 and 119 will each always sink approximately 3.5 to 4 milliamps. In a typical device, a number of such sense amplifier circuits are required, thereby greatly increasing the current consumption. For example, in a device which includes 16 sense amplifiers a minimum 48 milliamps of current is constantly consumed.

Furthermore, there are two nodes in output stage 104, i.e. nodes N1 and N2, which are critical with respect to the switching speed of the circuit. Node N1 has associated with it primarily the collectorbase capacitance of transistors 111, 122, and 129, as well as the collector to substrate capacitance of transistors 111 and 122, since capacitances of other components connected to node N1 are negligible. Similarly, node N2 has associated with it primarily the base-collector capacitances of transistors 109 and 131 plus the collector to substrate capacitance of transistor 109. Thus, unfortunately the circuit of FIG. 1 provides that the two critical nodes N1 and N2 of output stage 104 have associated therewith a relatively large capacitance, thereby causing nodes N1 and N2 to react relatively slowly to changes in voltage applied thereto.

FIG. 2 is a schematic diagram of another prior art sense amplifier 200, and its operation is now described with reference to Table 2. Sense amplifier 200 includes enable input circuit 201a, data input circuit 201b, enable sense amplifier circuit 202, data sense amplifier circuit 203 and output circuit 204. Circuit 200 reduces the amount of current required by utilizing current amplification in each circuit 202 and 203. Referring to enable sense amplifier 202, current source 240 typically sources only approximately 0.04 milliamps. This current is amplified by transistor 244 in order to sink approximately 0.4 milliamps of current supplied by resistor 243. When the current supplied by resistor 243 is not being sunk by transistor 244, it is available as base drive to transistor 245. Transistor 245 sinks approximately 3.5-4 milliamps in order to control node N2 of output stage 204.

With a logical zero enable input signal applied to enable input terminal 205, transistor 207 is off, and thus does not supply current to the cathode of diode 241. Thus, current source 240 obtains its current through resistor 242 and diode 241. This causes the base of transistor 244 to be pulled low, turning off transistor 244 and allowing resistor 243 to pull up the base of transistor 245 in order to turn on transistor 245. With transistor 245 turned on, node N2 is pulled low, disabling output stage 204.

Conversely, with a logical one enable input signal applied to terminal 205, transistor 207 is turned on. Transistor 207 supplies approximately 0.04 milliamps to current source 240. This causes diode 241 to cease conduction, thereby causing resistor 242 to supply base drive to transistor 244. This turns on transistor 244, pulling the base of transistor 245 low and turning off transistor 245, allowing node N2 of output stage 204 to be controlled by the state of phase splitter transistor 229, which in turn is controlled by the state of the data input signal applied to data input terminal 226.

The operation of data input stage 201b is similar to that of enable input stage 201a, and the operation of data sense amplifier 203 is similar to the operation of enable sense amplifier 202. The operation of output stage 204 is quite similar to the operation of output stage 104 (FIG. 1) and thus will not be described again in detail.

The key features of the sense amplifier of FIG. 2 is that, when enabled, enable sense amplifier circuit 202 sinks a relatively small amount of current, i.e., the 0.04 milliamps sunk by current source 240 plus approximately 0.04 milliamps base current supplied to transistor 244 by resistor 242, plus the approximately 0.4 milliamps collector current of transistor 244, or a total of approximately 0.48 milliamps. This in contrast to the circuit of FIG. 1 which requires that enable sense amplifier 102 always draw at least approximately 4 milliamps through its current source, plus additional related currents. When disabled, enable sense amplifier 202 consumes the 0.04 milliamp from resistor 242 through current source 240, approximately 0.4 milliamp base current applied to transistor 245 through resistor 243, and approximately 4 milliamps through transistor 245, or a total of approximately 4.404 milliamps. This is on the order of the current which is always consumed by the enable sense amplifier portion of the prior art sense amplifier of FIG. 1. The same current figures apply with regard to the data sense amplifier portion 203 of the circuit of FIG. 2.

However, this saving in current in the prior art circuit of FIG. 2 as compared with the prior art circuit of FIG. 1 is obtained at the expense of speed. The prior art enable sense amplifier circuit 102 of FIG. 1 requires no inversions of the signal applied to it in order to control nodes N1 and N2 of output stage 104 (the inversions caused by transistors 111 and 109, respectively). However, the prior art circuit of FIG. 2 requires two such inversions to control node N2 of output stage 204, i.e. the inversion provided by transistor 244 and the inversion provided by transistor 245. The same comments hold true for data sense amplifier 203. This results in a decrease in switching speed. Furthermore, critical node N1 has associated therewith the base-collector capacitances of transistors 255 and 229 plus the collector to substrate capacitance of transistor 255. Critical node N2 has associated therewith the base-collector capacitances of transistors 245 and 231 plus the collector to substrate capacitance of transistor 245. Thus, a relatively large amount of capacitance is associated with the critical nodes N1 and N2 in the prior art circuit of FIG. 2, thus causing it to switch rather slowly.

Accordingly, there remains a need for providing a sense amplifier which consumes low power, but which provides high switching speed.

SUMMARY

In accordance with the teachings of this invention, a novel sense amplifier is taught which minimizes power consumption by causing selected current sources to conduct current only when an input signal of a selected state is present. In accordance with the teachings of this invention, the speed of the circuit is fast because capacitance on the critical nodes is minimized by connection of fewer transistors to the critical nodes, as compared with the prior art.

DETAILED DESCRIPTION

Figure 1:
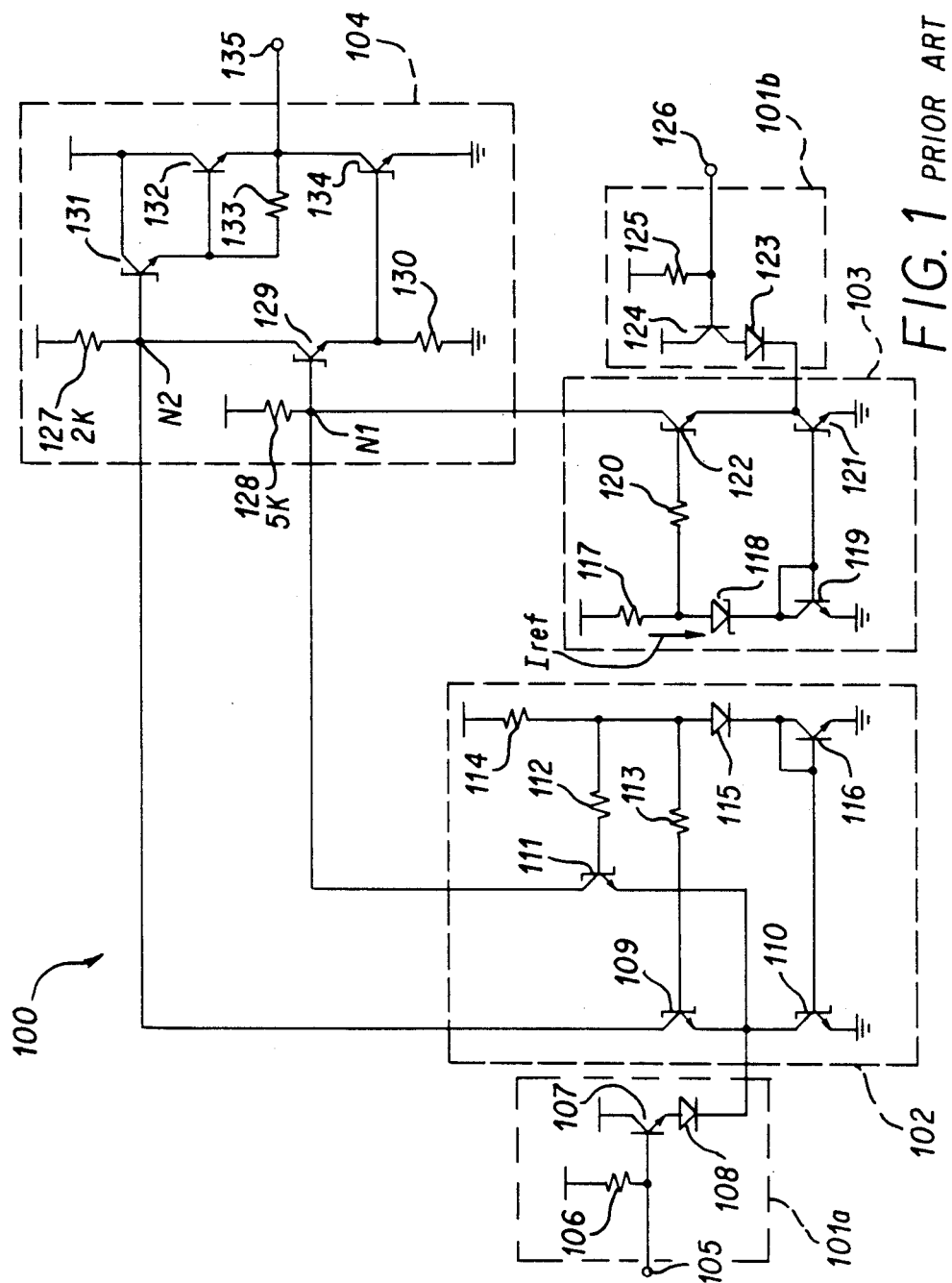
FIG. 1 is a schematic diagram of a prior art sense amplifier.
Figure 2:
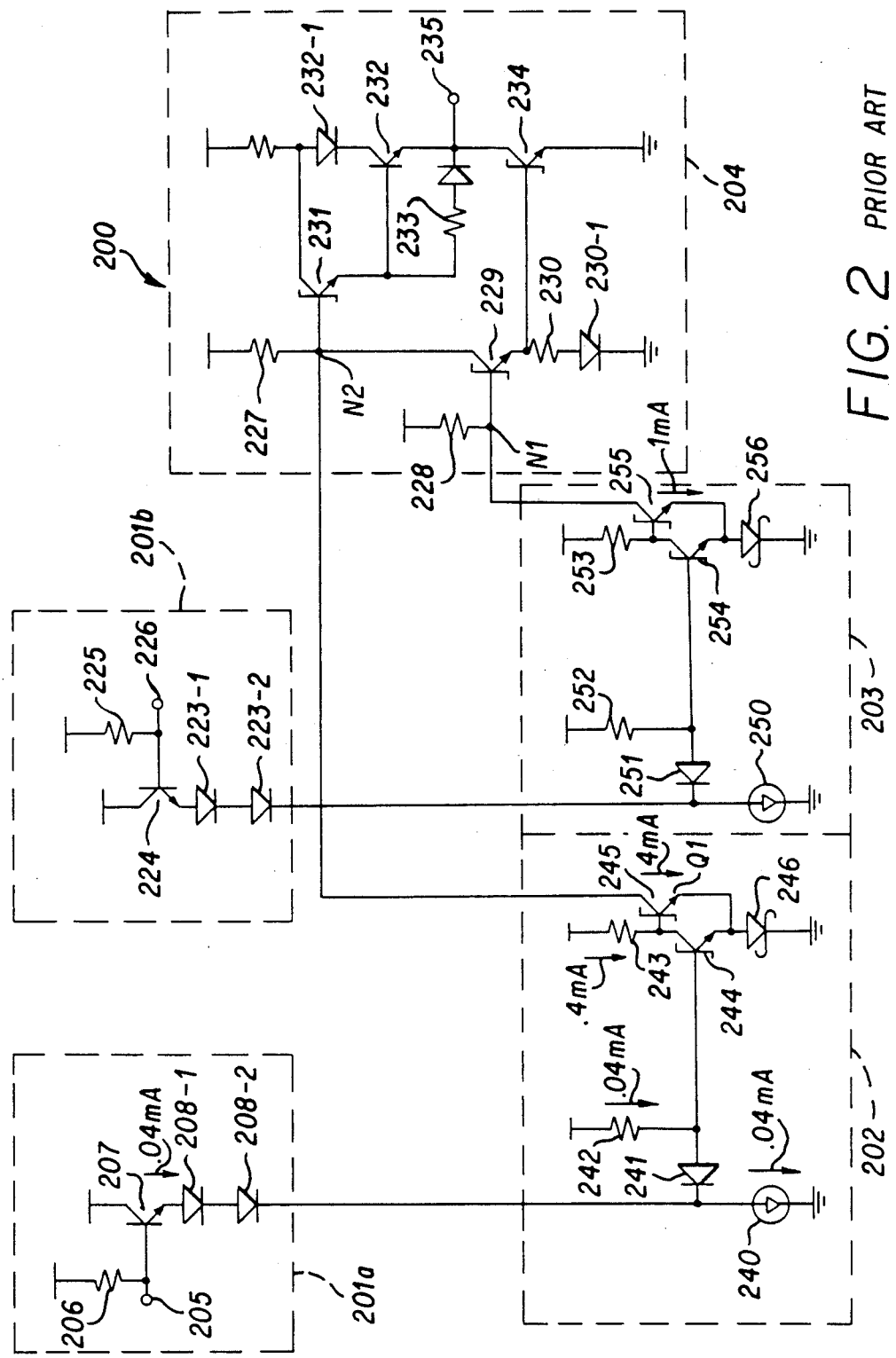
FIG. 2 is a schematic diagram of another prior art sense amplifier.
Figure 3:
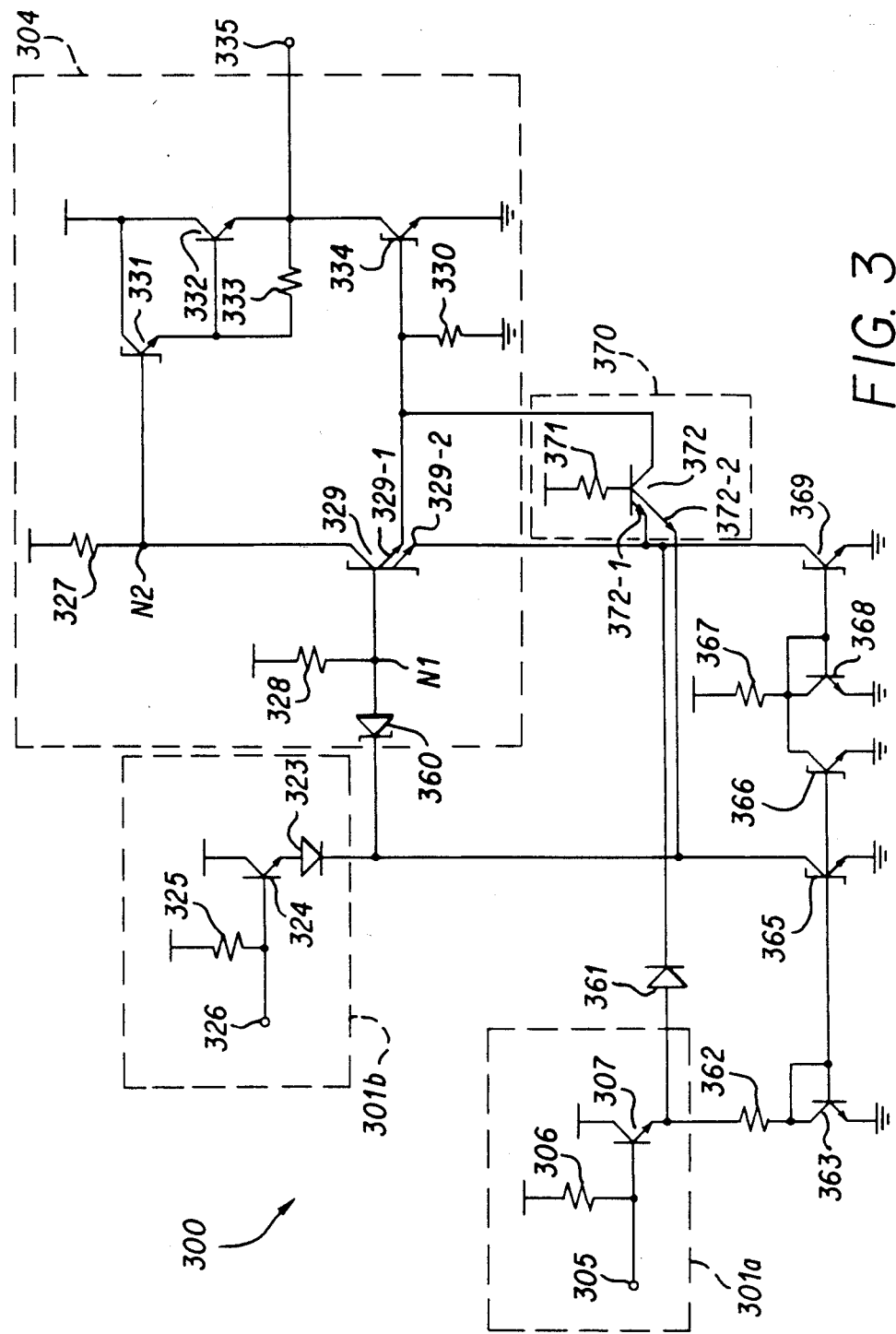
FIG. 3 is a schematic diagram of one embodiment of a sense amplifier constructed in accordance with the teachings of this invention.

FIG. 3 is a schematic diagram of one embodiment of a sense amplifier 300 constructed in accordance with the teachings of this invention, which is now described with reference to Table 3. Sense amplifier 300 includes data input circuit 301b including data input terminal 326 for receiving an input data signal. Circuit 300 also includes enable input circuit 301a including enable input terminal 305 which receives an enable input signal. Output stage 304 includes output terminal 335 for providing an output signal in response to the data input signal applied to data input terminal 326 when output circuit 304 is enabled by the enable signal applied to enable input terminal 305.

With a logical zero enable input signal applied to enable input terminal 305, transistor 307 is turned off, and thus current is not supplied to the collector of transistor 363, and thus transistor 363 is turned off. Thus, transistor 365 is turned off and the cathodes of diodes 323 and 360 are left floating, and the base of phase splitter transistor 329 is pulled high by resistor 328.

At the same time transistor 366 is off, since it receives no base drive from transistor 363. This causes the current made available by resistor 367 to be applied to transistor 368, which has its base and collector connected in common, thus turning on transistor 368. The collector current through transistor 368 is mirrored by transistor 369 and applied to emitter 329-2, causing phase splitter transistor 329 to turn on since the base of phase splitter transistor 329 is pulled high by resistor 328, as previously described. With phase splitter transistor 329 turned on, the collector of phase splitter transistor 329 is pulled low, as is the base of transistor 331 which is connected to node N2. Thus, transistors 331 and 332 are turned off, preventing output terminal 335 from being connected to the positive voltage supply. With emitter 329-2 pulled low, the base voltage of transistor 329 is equal to Vsat(369)+Vbe(329), which is insufficient to turn on the series connected base-emitter junctions of transistors 329 and 334. Thus, transistor 334 is off, preventing output terminal 335 from being connected to ground. Thus, output terminal 335 presents a high impedance, and sense amplifier 300 is disabled, regardless of the state of the data input signal applied to input terminal 326.

Of importance, during this disabled state, current source 363 is turned off, thus reducing power consumption. When disabled, current is consumed only by transistors 368 and 369, which consume approximately 1 milliamp and 3 milliamps, respectively.

Conversely, with a logical one enable signal applied to terminal 305, transistor 307 is turned on, and supplies current to the collector of transistor 363, turning on transistor 363. Transistor 363 supplies a base bias voltage to transistors 365 and 366. Thus, transistor 365 is turned on and the state of node N1 is dependent on the state of the input data signal applied to terminal 326.

At the same time transistor 366 is on. This causes the current made available by resistor 367 to be steered away from transistor 368, causing transistors 368 and 369 to be only slightly conducting. With transistor 369 conducting only slightly, its collector is high, as is emitter 329-2 of phase splitter transistor 329. Thus phase splitter transistor 329 is enabled, i.e., controlled by the signal provided on its base by node N1, which in turn is controlled by the data input signal applied to terminal 326. In one embodiment of this invention, transistors 368, 369, and 329 do not fully turn off in order to minimize their turn on times, thus increasing speed of the device. In an alternative embodiment to this invention, these transistors are allowed to fully turn off, although this results in a slower circuit.

With sense amplifier 300 enabled by the presence of a logical one enable signal on terminal 305, the output signal provided on output terminal 335 is dependent on the state of the data input signal applied to input terminal 326. With a logical zero data input signal applied to terminal 326, transistor 324 is off, node N1 remains low, the base of transistor 329 is low, and phase splitter transistor 329 is turn off. With phase splitter transistor 329 turned off, base drive is not provided to output pull down transistor 334, and thus transistor 334 is turned off. Similarly, with phase splitter transistor 329 turned off, node N2 is pulled high by resistor 327, and output pull up transistors 331 and 332 turn on thereby providing a logical one output signal on output terminal 335. Conversely, with a logical one data input signal applied to terminal 326, transistor 324 turns on, pulling node N1 high. The base of phase splitter transistor 329 is pulled high and phase splitter transistor 329 is turned on. With phase splitter transistor 329 turned on, base drive is provided to turn on output pull down transistor 334, thereby providing a logical zero output signal on the output terminal 335. Similarly, with transistor 329 turned on, node N2 is pulled low, and output pull up transistors 331 and 332 are turned off.

In one embodiment of this invention, Miller Killer circuit 370 is used to discharge the Miller capacitance associated with the base of transistor 334. Miller Killer 370 includes transistor 372 having a first emitter 372-1 connected to the collector of transistor 369, and a second emitter 372-2 connected to the collector of transistor 365. With the base of transistor 372 connected to a positive supply voltage via resistor 371, the collector of transistor 372 quickly pulls down the base of output pull down transistor 334 when transistor 365 turns on (output enabled) and the collector of transistor 365 is not pulled high by a logical one data input signal applied to input lead 326. The collector of transistor 372 also quickly pulls down the base of output pull down transistor 334 when transistors 369 turns on (output terminal disabled).

Of importance, the capacitance on critical node N1 is relatively small as it is only the base-collector capacitance of transistor 329. The capacitance of critical node N2 is also small and is composed of the base-collector capacitances of transistors 329 and 331 and the collector to substrate capacitance of transistor 329. Thus, the operation of the circuit of FIG. 3 is relatively fast.

Figure 4:
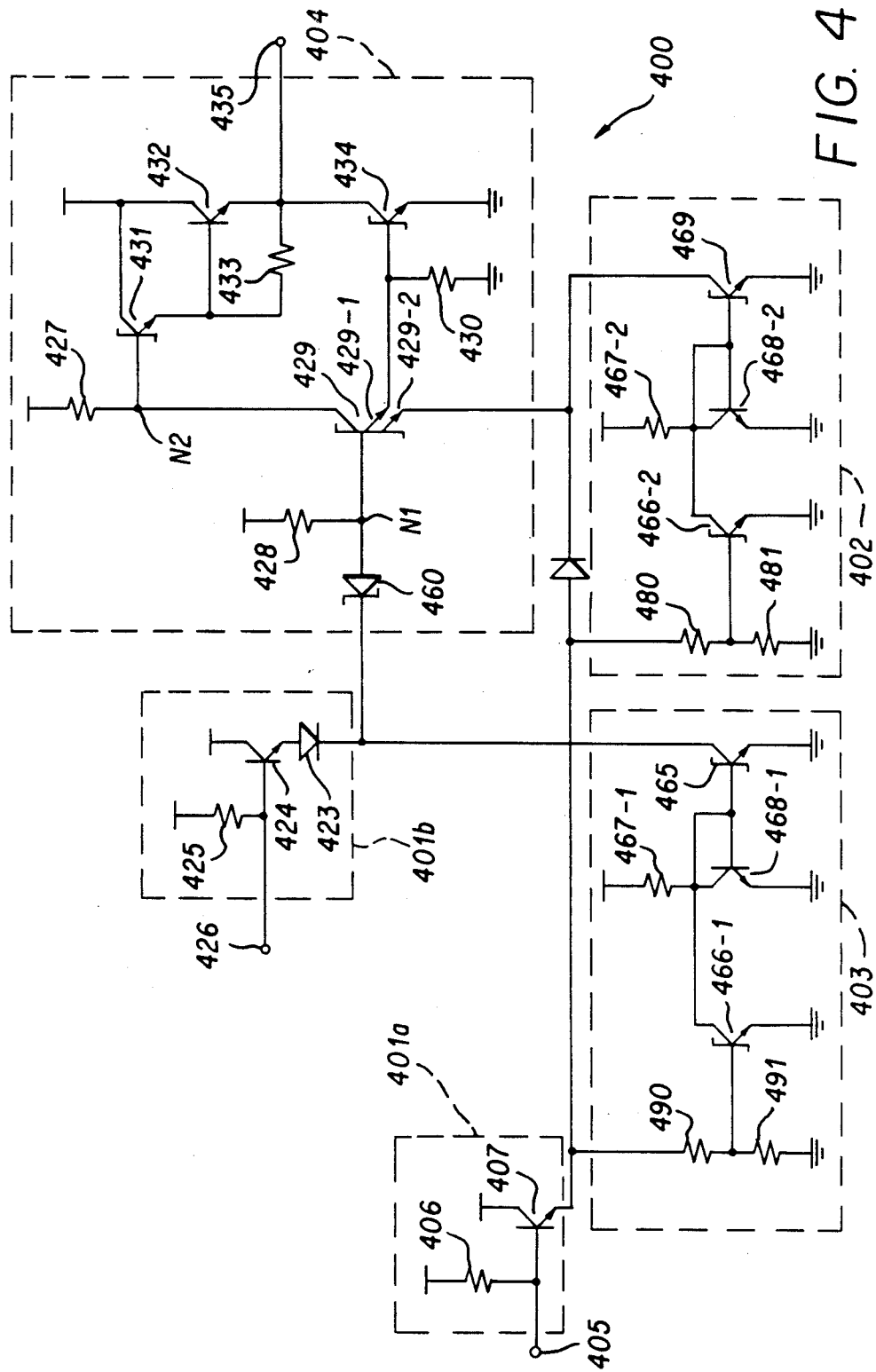
FIG. 4 is a schematic diagram of another embodiment of a sense amplifier constructed in accordance with the teachings of this invention.

FIG. 4 is an alternative embodiment of this invention which utilizes a separate data input sense amplifier 403 and enable input sense amplifier 402. Thus, certain components shown in FIG. 3 are replaced by a pair of components in the embodiment of FIG. 4, as shown in Table 5.

TABLE 5

| FIG. 3 | FIG. 4 |
| --- | --- |
| 326;363 | 490,491; 480,481 |
| 366 | 466-1;466-2 |
| 367 | 467-1;467-2 |
| 368 | 468-1;468-2 |
| 365 | 465 |
| 369 | 469 |

The operation of the embodiment of FIG. 4 is quite similar to that of the operation of FIG. 3 and is described in Table 4. The embodiment of FIG. 4 consumes slightly more current in the embodiment of FIG. 3 since additional components are used.

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

TABLE 1

| Data Input Signal (Terminal 126) | Q124 | Q122 | N1 | Enable Input Signal (Terminal 105) | Q107 | Q107 and Q111 | N1 | N2 | Q129 and Q134 | Q131 and Q132 | Output Signal (Terminal 135) |
| --- | --- | --- | --- | --- | --- | --- | --- | --- | --- | --- | --- |
| 0 | off | on | low | 0 | off | on | low | low | off | off | High Z |
| 1 | on | off | — | 0 | off | on | low | low | off | off | High Z |
| 0 | off | on | low | 1 | on | off | low | high | off | on | 1 |
| 1 | on | off | high | 1 | on | off | high | low due to | on | off | 0 |

TABLE 1-continued

| Data Input Signal (Terminal 126) | Q124 | Q122 | N1 | Enable Input Signal (Terminal 105) | Q107 | Q107 and Q111 | N1 | N2 | Q129 and Q134 | Q131 and Q132 | Output Signal (Terminal 135) |
|---|---|---|---|---|---|---|---|---|---|---|---|
| | | | | | | Q129 | | | | | |

TABLE 2

| Data Input Signal (Term. 226) | Q224 | Q254 | Q255 | N1 | Enable Input Signal (Term. 205) | Q207 | Q244 | Q245 | N2 | Q229 and Q234 | Q231 and Q232 | Output Signal (Term. 135) |
|---|---|---|---|---|---|---|---|---|---|---|---|---|
| 0 | off | off | on | low | 0 | off | off | on | low | off | off | High Z |
| 1 | on | on | off | low | 0 | off | off | on | low | off | off | High Z |
| 0 | off | off | on | low | 1 | on | on | off | high | off | on | 1 |
| 1 | on | on | off | high | 1 | on | on | off | low | on | off | 0 |

TABLE 3

| Data Input Signal (Term. 326) | Q324 | Enable Input Signal (Term. 305) | Q307, Q363, Q365, and Q366 | Q368 and Q369 | D361 | N1 | Q392-2 | N2 | Q329 | Q334 | Q331 and Q332 | Output Signal (Term. 335) |
|---|---|---|---|---|---|---|---|---|---|---|---|---|
| 0 | off | 0 | off | on | off | float | low | low | on | off | off | High Z |
| 1 | on | 0 | off | on | off | high | low | low | on | off | off | High Z |
| 0 | off | 1 | on | on slightly | on slightly | low | high | high | off | off | on | 1 |
| 1 | on | 1 | on | on slightly | on slightly | high | low | low | on | on | off | 0 |

TABLE 4

| Data Input Signal (Terminal Q426) | Q424 | Q422 | N1 | Enable Input Signal (terminal 405) | Q407 Q466-1 Q466-2 | Q465 and Q469 | N1 | N2 | Q429 and Q434 | Q431 and Q432 | Output Signal (Term. 435) |
|---|---|---|---|---|---|---|---|---|---|---|---|
| 0 | off | on | low | 0 | off | on | low | low | on | off | High Z |
| 1 | on | off | — | 0 | off | on | low | low | on | off | High Z |
| 0 | off | on | low | 1 | on | off | low | high | off | on | 1 |
| 1 | on | off | high | 1 | on | off due to Q129 | high | low | on | off | 0 |

What is claimed is:

1. An output circuit comprising:
   a first supply terminal for receiving a first supply voltage;
   a second supply terminal for receiving a second supply voltage;
   a data input terminal for receiving a data input signal;
   an output terminal for providing an output signal in response to said data input signal when said output terminal is enabled;
   pull up means having a first current handling terminal coupled to said first supply terminal, a second current handling terminal coupled to said output terminal, and a control terminal;
   pull down means having a first current handling terminal coupled to said output terminal, a second current handling terminal coupled to said second supply terminal, and a control terminal;
   an enable input lead for receiving an enable signal having a first state when said output terminal is to be enabled and a second state when said output terminal is to be disabled;
   a first current source which draws current in response to said second state of said enable input signal without regard to the state of said data input signal and which substantially does not draw current in response to said first state of said enable input signal; and
   a phase splitter transistor for applying a first control signal to said control terminal of said pull up means and a second control signal to said control terminal of said pull down means, said phase splitter transistor comprising:
   a collector coupled to said control terminal of said pull up means;
   a base coupled to said data input terminal;
   a first emitter coupled to said control terminal of said pull down means; and
   a second emitter coupled to said first current source,
   wherein in response to said enable input signal having said second state, said first current source draws current from said second emitter of said phase splitter transistor, causing said phase splitter transistor to turn on, thereby turning off said pull of and said pull down means.

2. A circuit as in claim 1 which further comprises:
   a second current source which draws current only in response to said enable input signal of said first state and without regard to the state of said data input signal; and
   a first switch means which turns on in response to said second current source drawing current, and in turn causes said first current source to not draw current.

3. A circuit as in claim 2 which further comprises a phase splitter control means which, in response to said second current source drawing current, pulls down said base of said phase splitter transistor in the absence of a high data input signal.

4. A circuit as in claim 1 which further comprises means for turning off said pull down means in response to either said data input signal being of a first state or said enable input signal being of said second state.

5. A circuit as in claim 3 which further comprises means for turning off said pull down means in response to either said data input signal being of a first state or said enable input signal being of said second state.

6. A circuit as in claim 5 wherein said means for turning off said pull down means comprises a transistor comprising:
   a base coupled to a supply voltage;
   a collector coupled to said control terminal of said pull down means;
   a first emitter coupled to said first current source; and
   a second emitter coupled to said phase splitter control means.

* * * * *